(12) United States Patent
Goldstein et al.

(10) Patent No.: US 6,777,768 B2
(45) Date of Patent: Aug. 17, 2004

(54) SEMICONDUCTOR OPTICAL COMPONENT AND A METHOD OF FABRICATING IT

(75) Inventors: Léon Goldstein, Chaville (FR); Christophe Ougier, Antony (FR); Denis Leclerc, Igny (FR); Jean Decobert, Nozay (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 10/233,398

(22) Filed: Sep. 4, 2002

(65) Prior Publication Data

US 2003/0042477 A1 Mar. 6, 2003

(30) Foreign Application Priority Data

Sep. 5, 2001 (FR) .............................. 01 11638

(51) Int. Cl.[7] .......................................... H01L 31/0232
(52) U.S. Cl. ........................... 257/432; 257/94; 257/96; 257/97; 372/50; 372/92; 359/344
(58) Field of Search .............................. 257/94, 96, 97; 372/50, 92; 359/344

(56) References Cited

U.S. PATENT DOCUMENTS

| | | | |
|---|---|---|---|
| 4,882,607 A | | 11/1989 | Shinada |
| 5,539,571 A | * | 7/1996 | Welch et al. ............... 359/344 |
| 5,790,580 A | * | 8/1998 | Sakata et al. ................ 372/50 |
| 5,793,521 A | * | 8/1998 | O'Brien et al. ............. 359/344 |
| 6,091,755 A | * | 7/2000 | Sanders et al. .............. 372/92 |

OTHER PUBLICATIONS

Walpole J N et al: " Diffractions–Limited 1.3–MUMWavelngth Tapered–Gain–Region Lasers with >1–W CW Output Power" IEEE Photonics Technology Letters, IEEE Inc. New York, US, vol. 8, No. 11, Nov. 1, 1996, pp. 1429–1431, XP000362620.

Liou K–Y et al: "High–Power Broad–Area Tapered Amplifier with a Monolithically Integrated Output Focusing Lens at 0.98–UM Wavelength" IEEE Journal of Selected Topics in Quantum Electronics, IEEE Service Center, US, vol. 1, No. 2, Jun. 1, 1995, pp. 165–172, XP000521081.

Colas E et al; "In Situ Definition of Semiconductor Structures by Selective Area Growth and Etching" Applied Physics Letters, American Institute of Physics. New York, US, vol. 59, No. 16, Oct. 14, 1991, pp. 2019–2021, XP000257432.

* cited by examiner

*Primary Examiner*—David Nelms
*Assistant Examiner*—Mai-Huong Tran
(74) *Attorney, Agent, or Firm*—Moser, Patterson & Sheridan, L.L.P.

(57) ABSTRACT

A semiconductor optical component is disclosed which includes a semiconductor material confinement layer containing acceptor dopants such that the doping is p-type doping. The confinement layer is deposited on another semiconductor layer and defines a plane parallel to the other semiconductor layer. Furthermore, the p-type doping concentration of the confinement layer has at least one gradient significantly different from zero in one direction in the plane. A method of fabricating the component is also disclosed.

12 Claims, 3 Drawing Sheets

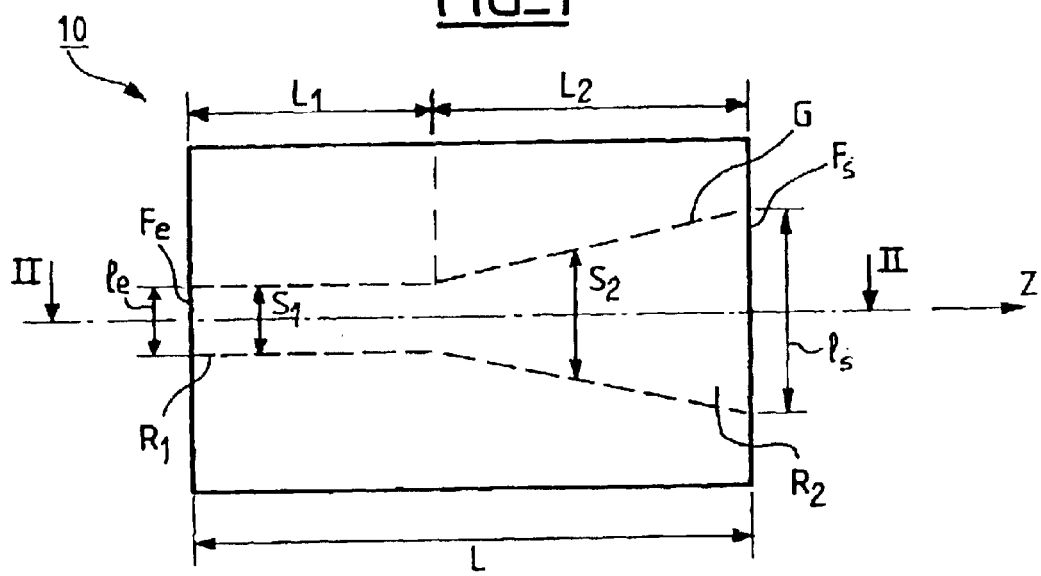
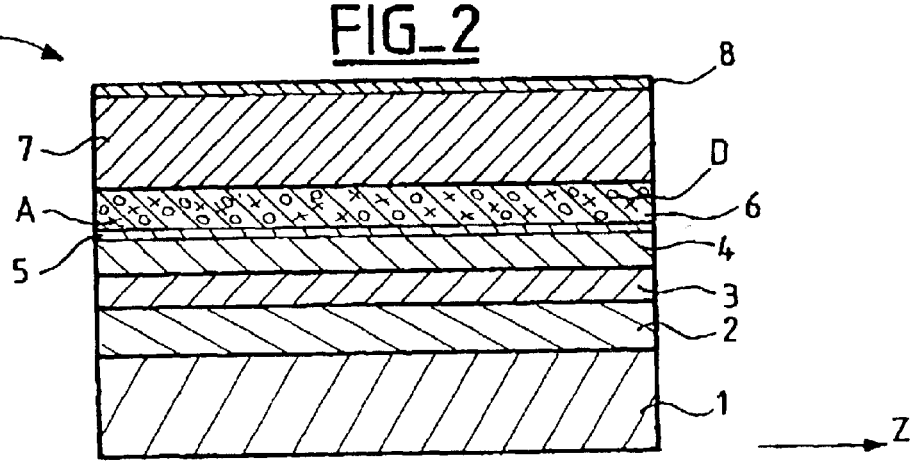
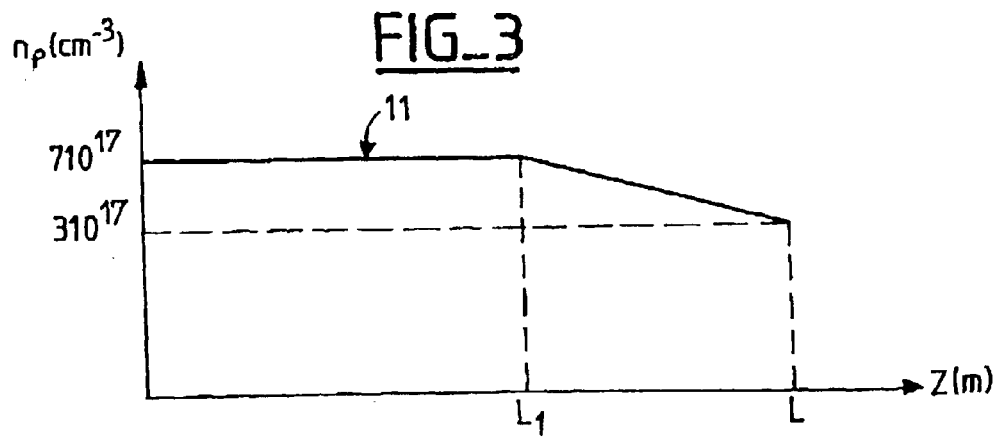

FIG_4
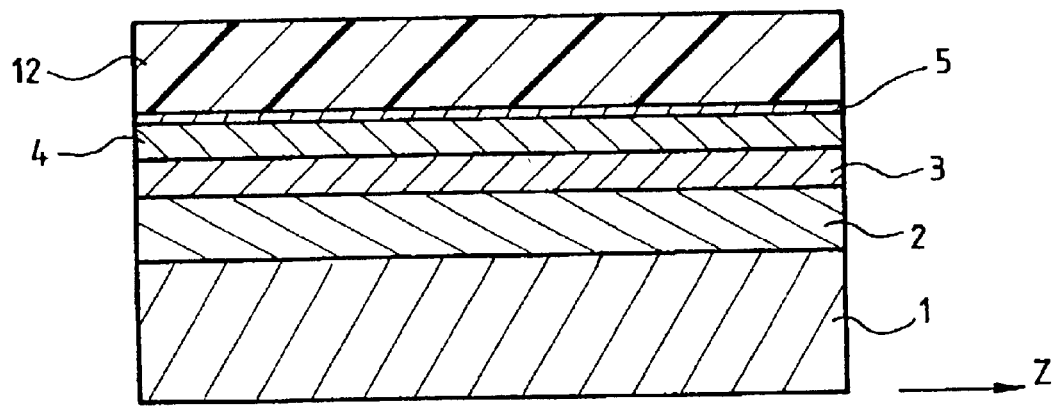
FIG_5
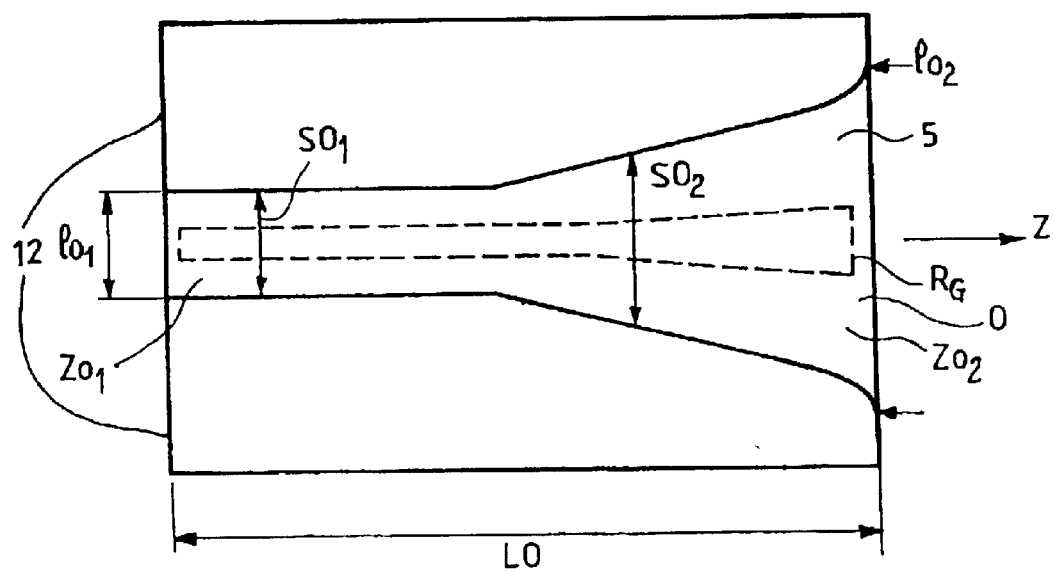

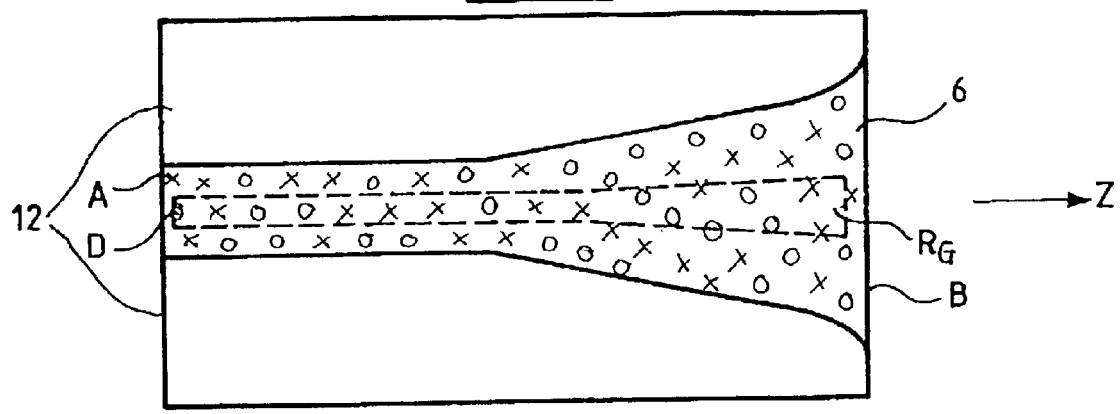
FIG_6
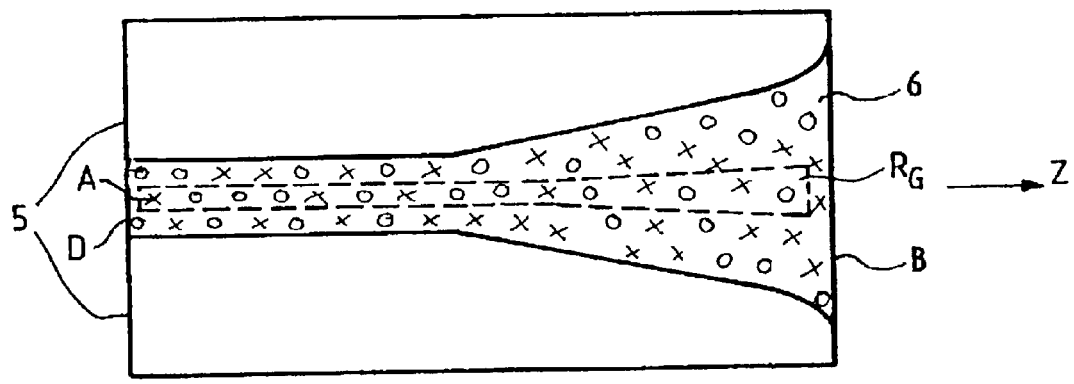
FIG_7
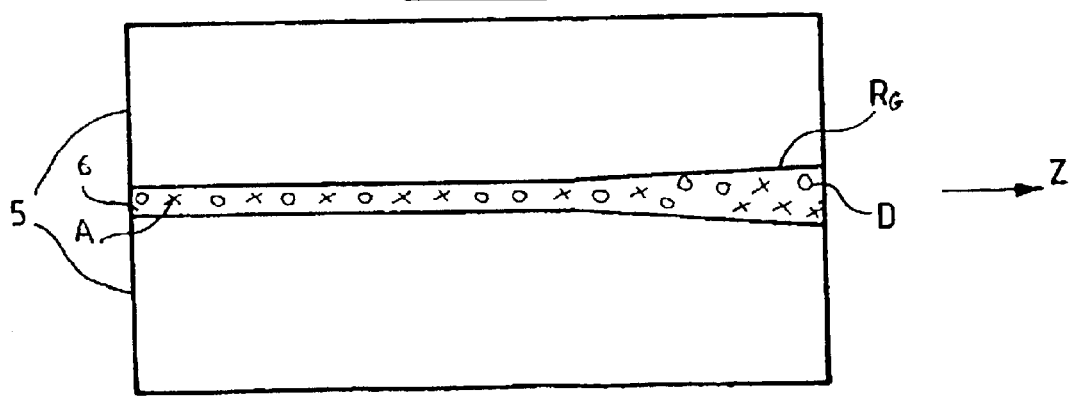
FIG_8

SEMICONDUCTOR OPTICAL COMPONENT AND A METHOD OF FABRICATING IT

CROSS-REFERENCE TO RELATED APPLICATIONS

This application is based on French Patent Application No. 01 11 638 filed Sep. 5, 2001, the disclosure of which is hereby incorporated by reference thereto in its entirety, and the priority of which is hereby claimed under 35 U.S.C. §119.

BACKGROUND OF THE INVENTION

1. Field of the Invention

The present invention relates to semiconductor optical components, and more particularly to a semiconductor optical component comprising a p-type doped semiconductor material confinement layer, and to a method of fabricating this type of component.

2. Description of the Prior Art

A semiconductor optical component, such as a semiconductor optical amplifier, is often used in prior art pumping sources rated at a few watts for amplifying wavelength division multiplex (WDM) optical signals by means of an optical fiber, in particular for Raman amplification of such signals. The operation of this kind of amplifier is based on the use of an active layer which, once supplied with current, amplifies an injected optical wave, generally at a wavelength from 0.8 $\mu$m to 1.6 $\mu$m, as it propagates.

A semiconductor optical component has a confinement layer disposed on top of the active layer and contributing to guiding the wave propagating in the component. The confinement layer is a layer of a semiconductor material containing electron acceptors creating positive free carriers known as holes. The holes then account for the greater part of the electrical conduction: the doping is referred to as p-type doping, which among other things yields a semiconductor confinement layer of lower electrical resistance than the intrinsic resistance of the semiconductor, which in particular avoids overheating of the component and ensures good injection of current into the active layer. However, this kind of doping introduces losses in the optical component, for example through photoabsorption. This is because the holes are able to absorb photons emitted by the active layer, thus limiting the optical power available from the component.

The confinement layer defines a plane parallel to the active layer. In modern components, the concentration of p-type dopants is uniform in this plane. To fix the value of the concentration, a compromise is therefore arrived at to obtain the lowest possible resistance and at the same time the lowest possible overall losses.

The probability of photoabsorption increases with the optical power, i.e. with the number of photons. Accordingly, for a given concentration of p-type dopants, the losses generated are greater in some regions of the optical component. Similarly, the intrinsic resistance of the confinement layer can vary locally, for example if the thickness or the width of the layer varies.

An object of the present invention is therefore to provide a semiconductor optical component comprising a p-type doped semiconductor confinement layer having optoelectrical properties that are optimized in each region in order to improve the performance of the component.

SUMMARY OF THE INVENTION

To this end, the present invention proposes a semiconductor optical component including a semiconductor material confinement layer containing acceptor dopants such that the doping is p-type doping, in which component the confinement layer is deposited on another semiconductor layer and defines a plane parallel to the other semiconductor layer and the p-type doping concentration of the confinement layer has at least one gradient significantly different from zero in one direction in the plane.

The gradient(s) are determined as a function of the local electro-optical properties required in the semiconductor optical component according to the invention.

The direction can advantageously be the light propagation axis, the optical power varying along that axis.

According to the invention, the sign of the gradient can be negative, which is advantageous in a region necessitating minimum optical losses.

In one embodiment of the invention, the semiconductor material further contains donors whose concentration is lower than the concentration of the acceptors over the whole of the direction so that the doping remains of the p-type.

In this configuration, the p-type doping concentration corresponds to the difference between the acceptor concentration and the donor concentration. The doping gradient can thus be obtained from a donor concentration gradient.

The acceptors are preferably chosen from zinc, magnesium and cadmium and the donors are preferably chosen from silicon and sulfur.

According to the invention, the semiconductor material can be chosen from alloys based on materials from column (s) III and/or V of the periodic table of the elements, such as alloys based on InP and GaAs.

In one preferred embodiment of the invention, the component is a tapered guide semiconductor optical amplifier including a tapered optical guide having a length L along the light propagation axis disposed between an entry face and an exit face, the tapered guide including a cross section region having a constant surface area, referred to as the constant section region, for monomode propagation of light, the constant section region leading to a cross section region having an increasing surface area, referred to as the increasing section region, in order to reduce the optical power density of the semiconductor optical amplifier. Also, the confinement layer is part of the optical guide and the gradient is negative and is in the increasing section region along the propagation axis.

The surface area of the increasing section region is greater than that of the constant section region so that the resistance in the increasing section region is less than that in the constant section region. Moreover, as the optical power increases from the entry face to the exit face, the optical losses are liable to be greater in the increasing section region. It is therefore advantageous to reduce the p-type doping concentration in that region.

In one configuration of this latter embodiment, the gradient is situated over the whole of the increasing section region to optimize the performance of the component according to the invention.

To increase the optical power available from the component according to the invention, the p-type doping concentration can advantageously be at a minimum at the exit face.

Furthermore, in this latter embodiment, the minimum concentration is from $10^{17}$ cm$^{-3}$ to $10^{18}$ cm$^{-3}$ and is preferably substantially equal to $3 \times 10^{17}$ cm$^{-3}$.

The invention also proposes a method of fabricating a semiconductor optical component according to the invention, the method including the following steps:

a masking step by depositing a silica type dielectric material masking layer onto another semiconductor layer, a step of partial elimination of the masking layer to create an opening exposing the other layer, and a step of depositing the confinement layer, in which the confinement layer is deposited selectively in the opening.

The confinement layer in accordance with the invention is selectively deposited over the opening using the selective area growth (SAG) technique described in the paper by A. M. Jones et al. "Growth, Characterization, and Modeling of Ternary InGaAs—GaAs, Quantum Wells by Selective Area Metalorganic Chemical Vapor Deposition", Journal of Electronic Materials, Vol. 24, No 11, 1995, pages 1631–1636. The SAG technique is based on the fact that GaAs or InP type materials are not deposited on a silica oxide mask and therefore diffuse toward the semiconductor substrate.

The method according to the invention can further include a step of totally suppressing the masking layer after the step of depositing the confinement layer.

The method of fabricating a component in accordance with the invention can include a step of partly suppressing the confinement layer after the total suppression step.

The features and objects of the present invention will emerge from the following detailed description, which is given with reference to the accompanying drawings, which are provided by way of illustrative and non-limiting example.

BRIEF DESCRIPTION OF THE DRAWINGS

FIG. 1 is a diagrammatic plan view of a tapered guide semiconductor optical amplifier according to the invention.

FIG. 2 is a diagrammatic sectional view of the optical guide of the tapered guide semiconductor optical amplifier from FIG. 1 in a plane perpendicular to the faces of the guide G.

FIG. 3 shows the p-type doping concentration profile of a confinement layer of the optical guide from FIG. 2 as a function of the length of the optical guide along the light propagation axis Z.

FIGS. 4 to 8 represent steps of a fabrication method in accordance with the invention for fabricating the tapered guide semiconductor optical amplifier from FIG. 1.

DETAILED DESCRIPTION OF THE PREFERRED EMBODIMENT

Throughout the following description, the term "layer" can designate a single layer or a stack of layers fulfilling the same function.

FIG. 1 is a diagrammatic plan view of a tapered guide semiconductor optical amplifier 10 according to the invention which is used, for example, in a pumping source for amplifying WDM signals by means of an optical fiber using Raman amplification or an erbium-doped fiber amplifier (EDFA).

The tapered guide semiconductor optical amplifier 10 includes a tapered optical guide G (shown in dashed outline) of length L equal to approximately 2 mm along the light propagation axis Z. The optical guide G is disposed between an entry face Fe of width Le equal to approximately 2 $\mu$m and an exit face Fs of width Ls equal to approximately 6 $\mu$m. The guide G includes a region $R_1$ of length $L_2$ having a cross section $S_1$ of constant surface area, also referred to as the constant section region, for monomode propagation of light.

The region $R_1$ leads to a region $R_2$ of length $L_2$ equal to a few hundred microns and having a cross section $S_2$ of increasing surface area, also referred to as the increasing section region, for reducing the optical power density of the semiconductor optical amplifier 10.

The tapered optical guide G is the region at the heart of the invention.

Accordingly, FIG. 2 is a diagrammatic sectional view of the tapered optical guide of the tapered guide semiconductor optical amplifier from FIG. 1 in a plane perpendicular to the faces of the guide G.

The tapered optical guide G includes a GaAs support 1 on which are deposited, by the metal organic vapor phase epitaxy (MOVPE) process:

a lower confinement layer 2 of a semiconductor alloy based on InP or GaAs doped with electron donors, and thus of the n-type, a semiconductor buffer layer 3, for encouraging the growth of subsequent layers, an active layer 4 of a semiconductor alloy based on InP or GaAs intended to amplify light, and possibly incorporating quantum wells, another semiconductor layer 5, referred to as a protection layer, having a thickness of the order of 0.1 $\mu$m, a p-type doped confinement layer 6 according to the invention of a semiconductor alloy based on InP or GaAs, whose thickness varies longitudinally from approximately 0.5 $\mu$m to approximately 1 $\mu$m, a semiconductor layer 7, referred to as the contact layer, which is strongly p-type doped and contributes to correct injection of an electric current, and a metal metalization layer 8.

The confinement layer 6 contains zinc electron acceptors A and a lower concentration of silicon electron donors D. The p-type doping concentration $n_p$ corresponds to the difference between the concentration of acceptors A and the concentration of donors D.

FIG. 3 shows a curve 11 representing the p-type doping concentration profile $n_p$ of the confinement layer 6 as a function of the length L of the tapered optical guide G along the propagation axis Z.

The concentration $n_p$ is substantially constant in the region $R_1$ and therefore over the whole of the length $L_1$. It is typically equal to approximately $7 \times 10^{17}$ cm$^{-3}$. The concentration $n_p$ decreases substantially linearly in the region $R_2$ and therefore has a constant negative gradient along the light propagation axis Z. The minimum value of the p-type doping concentration is found at the exit face Fs (see FIG. 1) at Z=L and is substantially equal to $3 \times 10^{17}$.

FIGS. 4 to 8 show the steps of a method of fabricating the tapered guide semiconductor optical amplifier from FIG. 1.

FIG. 4 shows a longitudinal section of the tapered guide semiconductor optical amplifier 10 obtained after a series of successive MOVPE depositions on the same face of a GaAs support 1:

deposition of the lower confinement layer 2, deposition of the buffer layer 3, deposition of the active layer 4, and deposition of the protection layer S.

The process then includes a masking step of depositing a masking layer 12 of a silica type dielectric material onto the protection layer 5 by the plasma enhanced chemical vapor deposition (PECVD) process.

FIG. 5 is a plan view of the semiconductor optical amplifier 10 obtained after a step of partial elimination of the masking layer 12 to create an opening O above the protection layer 5.

The opening O includes a first area $Zo_1$ having a cross section $SO_1$ of constant surface area. The width $Io_1$ of the constant surface area is of the order of 10 µm. The opening O also includes an area $Zo_2$ having a cross section $SO_2$ of increasing surface area. The width $Io_2$ of the increasing surface area at the edge B of the opening O is of the order of 20 µm to 50 µm. The length LO of the opening O is substantially greater than the length L of the optical guide G.

A region $R_G$ which corresponds to the region containing the confinement layer 6 when the semiconductor optical amplifier is finished is shown in dashed outline in the opening O.

FIG. 6 is a plan view of the semiconductor optical amplifier 10 obtained after a step of MOVPE deposition of the confinement layer 6.

The confinement layer 6 is deposited selectively over the opening O by the SAG technique. The InP or GaAs does not adhere to the silica, and therefore diffuses laterally toward the opening O. The area $Zo_1$ being narrower than the area $Zo_2$, the diffusion is greater in the area $Zo_1$ with the result that the average growth speed $v_1$ in the area $Zo_1$ can be approximately twice the average growth speed $v_2$.

For example, $v_1$ and $v_2$ are respectively equal to 2 µm/h and 1 µm/h when the semiconductor optical amplifier is at a temperature of the order of 600° C. and for a given flux containing In and P or Ga and As. For a deposition time of the order of 30 minutes, the average thickness of the layer 6 in the areas $Zo_1$ and $Zo_2$ is respectively equal to approximately 1 µm and approximately 0.5 µm.

Furthermore, to produce the p-type doping, a flow comprising acceptors such as zinc, such as a flow of diethyl zinc, and a flow comprising donors D such as silicon, such as a flow of silane, are added to the flow of InP or of GaAs.

The zinc concentration is virtually independent of the growth speed, and is therefore also virtually identical in the areas $Zo_1$ and $Zo_2$. On the other hand, the silicon concentration is inversely proportional to the growth speed $v_1$, $v_2$, and is therefore greater in the area $Zo_2$ and at a maximum at the edge B.

The p-type doping concentration $n_p$ is therefore substantially constant in the region $Zo_1$ along the axis Z and is equal to approximately $7 \times 10^{17}$ cm$^{-3}$. The concentration $n_p$ has a constant negative gradient in the region $Zo_2$ along the axis Z. The concentration $n_p$ at the edge B is substantially of the order of $3 \times 10^{17}$ cm$^{-3}$.

FIG. 7 is a plan view of the semiconductor optical amplifier 10 obtained after a step of total suppression of the masking layer 12 following the step of depositing the confinement layer 6.

FIG. 8 is an elevation view of the semiconductor optical amplifier 10 obtained after a step of partial suppression of the confinement layer 6 outside the region $R_G$ in order to limit the confinement layer 6 in the optical guide G.

The above steps are followed by a series of conventional deposition, masking and etching steps to obtain the semiconductor optical amplifier 10.

The invention can equally be applied to a semiconductor optical component including an optical guide of constant cross section and to all categories of semiconductor optical amplifiers: buried ridge semiconductor optical amplifiers, gain-guided semiconductor optical amplifiers, and index-guided semiconductor optical amplifiers.

The invention can also be employed in optical components for which the required current density is non-uniform, such as some Mach Zehnder interferometer structure components. In this way, the invention can be substituted for a solution based on a distributed electrode.

Furthermore, the shape of the opening O is chosen as a function of the gradients required in accordance with the invention. The gradient(s) can be constant or vary in the chosen direction.

The cross section(s) of an optical guide of a semiconductor optical component according to the invention can be rectangular or trapezoidal.

What is claimed is:

1. A semiconductor optical component having an entry face and an exit face and including a semiconductor material confinement layer containing acceptor dopants such that the doping is p-type doping, in which component the confinement layer is deposited on another semiconductor layer and defines a single plane between the entry face and the exit face parallel to the other semiconductor layer and the p-type doping concentration of the confinement layer has at least one gradient significantly different from zero in one direction in the plane.

2. The semiconductor optical component claimed in claim 1 wherein the one direction is a light propagation axis.

3. The semiconductor optical component claimed in claim 2 wherein the gradient is such that the p-type doping concentration decreases towards the exit face.

4. The semiconductor optical component claimed in claim 3 wherein the semiconductor material further contains donors at a concentration lower than the acceptor concentration over the whole of the one direction.

5. The semiconductor optical component claimed in claim 4 wherein the acceptors are chosen from zinc, magnesium and cadmium.

6. The semiconductor optical component claimed in claim 4 wherein the donors are chosen from silicon and sulfur.

7. The semiconductor optical component claimed in claim 1 wherein the semiconductor material is an alloy based upon materials chosen from columns III and V of the periodic table of the elements.

8. The semiconductor optical component of claim 1, the semiconductor optical component being a tapered guide semiconductor optical amplifier and including a tapered optical guide disposed along a light propagation axis between the entry face and the exit face, the tapered guide including a first region having a constant cross-sectional area for monomode propagation of light, the tapered guide further including a second region coupled to the first region and having an increasing cross-sectional area for reducing the optical power density of the semiconductor optical amplifier, wherein the confinement layer is a part of the tapered optical guide, wherein the gradient is directed along the light propagation axis within the second region such that the p-type doping concentration decreases towards the exit face.

9. The semiconductor optical component of claim 8 wherein the gradient is situated over the whole of the second region.

10. The semiconductor optical component of claim 8 wherein the p-type doping concentration is at a minimum at the exit face.

11. The semiconductor optical component of claim 10 wherein the minimum concentration is from $10^{17}$ cm$^3$ to $10^{18}$ cm$^3$ and preferably substantially equal to $3 \times 10^{17}$ cm$^3$.

12. The semiconductor optical component of claim 1 wherein the semiconductor material is an alloy based upon a compound chosen from the group consisting of InP and GaAs.

* * * * *